United States Patent
Nakahata (10) Patent No.: US 7,861,197 B2
(45) Date of Patent: Dec. 28, 2010

(54) METHOD OF VERIFYING DESIGN OF LOGIC CIRCUIT

(75) Inventor: Hitoshi Nakahata, Tokyo (JP)

(73) Assignee: Oki Semiconductor Co., Ltd., Tokyo (JP)

(*) Notice: Subject to any disclaimer, the term of this patent is extended or adjusted under 35 U.S.C. 154(b) by 440 days.

(21) Appl. No.: 11/976,369

(22) Filed: Oct. 24, 2007

(65) Prior Publication Data

US 2008/0163144 A1     Jul. 3, 2008

(30) Foreign Application Priority Data

Dec. 27, 2006   (JP) .............................. 2006-351466

(51) Int. Cl.
G06F 17/50 (2006.01)

(52) U.S. Cl. .............................................. 716/5; 716/4

(58) Field of Classification Search .................. 716/4–5
See application file for complete search history.

(56) References Cited

U.S. PATENT DOCUMENTS

| 7,610,571 B2* | 10/2009 | Chen .............................. 716/5 |
| 2007/0245278 A1* | 10/2007 | Chen .............................. 716/5 |
| 2009/0089725 A1* | 4/2009 | Khan ............................. 716/5 |

FOREIGN PATENT DOCUMENTS

JP        2002-259487 A        9/2002

* cited by examiner

Primary Examiner—Jack Chiang
Assistant Examiner—Brandon W Bowers
(74) Attorney, Agent, or Firm—Rabin & Berdo, P.C.

(57) ABSTRACT

A method of verifying a design of logic circuit of a semiconductor device having a first circuit block to which the power continuously applied and a second circuit block receiving the power which turns on/off in response to the state of operation modes includes replacing a first basic logic cell including a storage element to a first verification logic cell in the blocks, replacing a second basic logic cell having no storage cell to a second verification logic cell in the blocks, and performing a logical simulation of the device.

4 Claims, 5 Drawing Sheets

| VDA | VDB | AI | AO |
|---|---|---|---|
| 0 | * | * | x |
| 1 | 1 | 0 | 0 |
| 1 | 1 | 1 | 1 |
| 1 | 0 | 0 | 0 |
| 1 | 0 | 1 | x |

METHOD OF VERIFYING DESIGN OF LOGIC CIRCUIT

CROSS-REFERENCE TO RELATED APPLICATION

This application claims the priority benefit of Japanese Patent Application No. 2006-351466 filed Dec. 27, 2006, the entire disclosure of which is incorporated herein by reference.

BACKGROUND OF THE INVENTION

1. Field of the Invention

The invention relates to a method of verifying a design of a logic circuit, and specifically, relates to a verification of a function or an operation of the semiconductor device at power-off/on.

2. Description of the Related Art

It is essential to design a semiconductor circuit (hereinafter called an LSI) having low power consumption in order to use it in cellular phones. To satisfy this requirement, several ways to perform the low power consumption have been presented. One of them is that the power line for a certain circuit block, whose function is halted in response to a state of the operation mode, is physically disconnected.

In development of the LSI, when a design for a particular circuit is made, a function or an operation of the circuit designed in the logic level is verified by computer simulation. When an LSI having a function that un-used circuit block is electrically disconnected is designed, the entire circuit of the LSI is divided into circuit blocks for simulation, each of which uses a same power supply, in order to verify the function of the entire circuit. Then, the function of each circuit block is verified by comparing with verification patterns for each divided circuit block.

Thus, when the simulation is performed for each circuit block, it is required to generate a verification pattern for each circuit block to be compared. Thus, it is required to spend time and human effort to prepare the simulation, perform the simulation, and analyze the results of the simulation. In some cases, some circuits, which should not be divided, may be divided by accident during the circuit dividing process. To resolve this problem, it has been proposed to insert a pseudo-cell between the circuit blocks, each of which is operated with a different power supply so that a logic level of a signal applied to a circuit block at the next stage can be controlled. As a result, the function of the entire circuit is verified.

Figure 2:
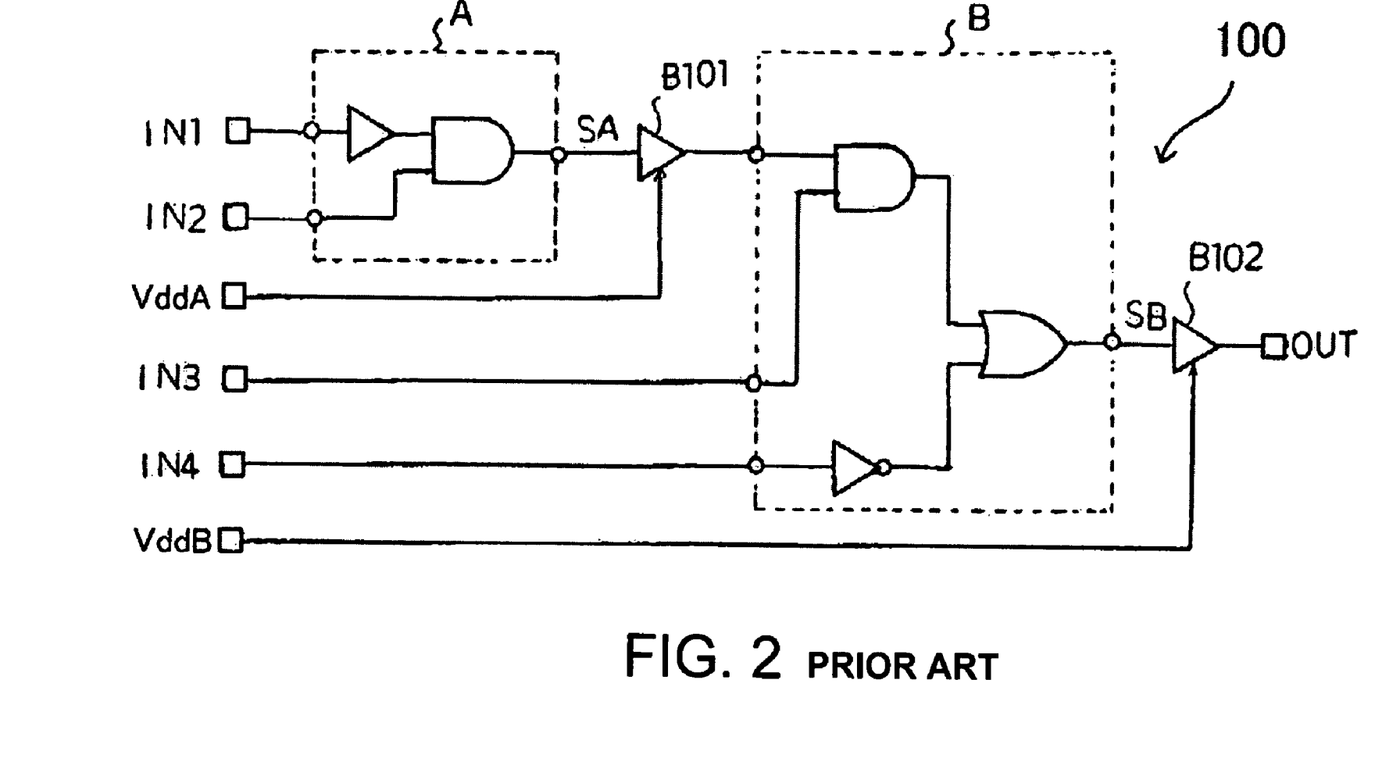
FIG. 2 is a diagram for a circuit subjected to a simulation, according to the related art.

FIG. 2 is a diagram for a circuit subjected to simulation, in which a pseudo-cell is placed between circuit blocks: The circuit 100, which is subjected simulation, includes a first circuit block A operated by supplying a first supply voltage VddA, and a second circuit block B operated by supplying a second supply voltage VddB. The first circuit block A outputs a first output signal SA in response to first and second signals IN1 and IN2, and the second circuit block B outputs a second output signal SB in response to the first output signal SA from the first circuit block A, and third and fourth signals IN3 and IN4. The first output signal SA, outputted from the first circuit block A, is supplied to the second circuit block B through a first pseudo-cell B101 having a control terminal connected to the first supply voltage VddA. The second output signal SB, outputted from the second circuit block B, is outputted as an output signal OUT through a second pseudo-cell B102 having a control terminal connected to the second supply voltage VddB. In the circuit 100, a three-state buffer is used for each of the first and second pseudo-cells B101 and B102. The three-state buffer used in the first pseudo-cell B101 outputs a signal having a logic level that is the same as the first output signal SA, when the first power supply VddA having the logic level "1" is applied to its control terminal, and causes its output terminal to reach a high impedance state when the first power supply VddA having the logic level "0" is applied to its control terminal. Similarly, the three-state buffer used in the second pseudo-cell B102 outputs a signal having a logic level that is the same as the second output signal SB, when the second power supply VddB having the logic level "1" is applied to its control terminal, and causes its output terminal to reach a high impedance state when the second power supply VddB having the logic level "0" is applied to its control terminal.

When the simulation is performed with the circuit 100 shown in FIG. 2, there is an advantage that the function of the entire circuit can be verified for its function. On the other hand, if one of the circuit blocks A and B includes a storage element, such as a flip-flop circuit, a certain signal level is maintained in the circuit block, whose power supply should be disconnected for the purpose of verification. For this reason, since the verification using the circuit 100 after reconnecting the power supply is not followed to the real circuit, the verification by this method is not completed to verify all of the circuits of the LSI.

To overcome this problem, another simulation method has been presented, as shown in JP 2002-259487. The simulation disclosed in JP 2002-259487 is a multiple-power-supply circuit simulation. In this simulation, a pseudo power supply cell having an input terminal is disposed in each of a plurality of functional hierarchies of circuit data in a circuit subjected to a simulation. Execution circuit data connecting each power supply terminal of the functional hierarchies and each input terminal of the arranged pseudo power supply cell, respectively, are created and read. A change in input-signal level is detected in accordance with a verification signal pattern. In response to the level of the input terminal of the pseudo power supply cell at the time of the input signal level change, a judgment is made as to whether or not the power supply of the hierarchies subjected turns on or off. A simulation for only the subjected hierarchy whose power supply is turned on is performed. As a result, it is possible easily to perform the simulation at the time of the connection with or disconnection from power supply for the multiple power supply circuit, so that an increase in the number of verification steps can be suppressed, and the duration of verification can be shortened.

However, according to the simulation disclosed in JP 2002-259487, it is difficult to detect the misconnection of the logic cells in each functional hierarchy, and also difficult to verify whether or not all data stored in the circuit is clear. Further, since the simulation disclosed in JP 2002-259487 is quit different from the conventional simulation described above, a conventional simulator cannot be used for it.

SUMMARY OF THE INVENTION

An objective of the invention is to solve the above-described problem and to provide a method for verifying a function and an operation of a logic circuit having a plurality of a circuit blocks at the disconnection and the reconnection of the power supply.

The objective is achieved by a method of verifying a design of a logic circuit of a semiconductor device having a first circuit block and a second circuit block, the first circuit block receiving a first power supply continuously, and the second circuit block receiving a second power supply that turns on/off in response to a state of operation modes, including a first process for replacing a first basic logic cell including a storage element, which is located in the first or the second circuit block, to a first verification logic cell, which outputs a first signal as a logical result by its input signal incorporated only at a time that power is supplied by the second power supply to the circuit block to which the basic logic cell belongs, a second process for replacing a second basic logic cell including no storage elements, which is located in the first or second circuit block, to a second verification logic cell, which outputs a second signal as a logical result only at a time that the second power supply supplied power to the circuit block to which the basic logic cell belongs and a third process for performing a logical simulation of the semiconductor device including the first and second verification logic cells, which have been replaced from the first and second basic logic cells by the first and the second processes.

BRIEF DESCRIPTION OF THE DRAWINGS

The invention will be more particularly described with reference to the accompanying drawings, in which.

DETAILED DESCRIPTION OF THE PREFERRED EMBODIMENTS

The preferred embodiment of the invention is explained together with drawings as follows. In each drawing, the same reference numbers designate the same or similar components.

Initially, a preferred embodiment of the invention is explained with reference to some of the drawings as follows. In the preferred embodiment, a location or a size of each component in the drawings is illustrated for just understanding the invention. Further, material or numerical limitations for each component are described as preferred examples so that the scope of the invention is not limited to such a material or numerical limitation. Thus, the scope of the invention is not limited to the following embodiments.

Figure 1:
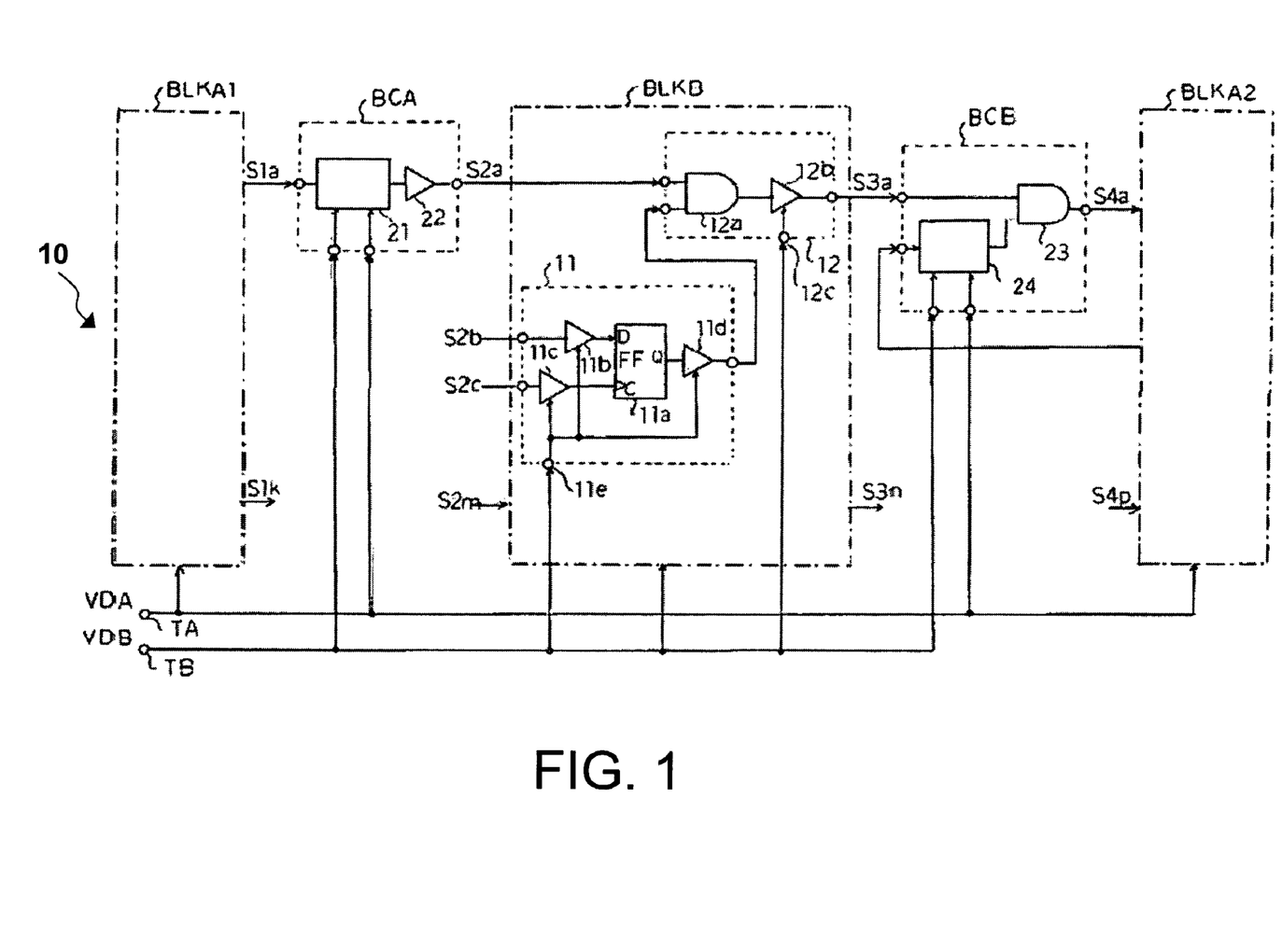
FIG. 1 is a diagram for a circuit subjected to a simulation, according to a preferred embodiment of the invention.

FIG. 1 is a diagram of a circuit 10 subjected to simulation, according to a preferred embodiment of the invention. The circuit 10 shown in FIG. 1 is a simulation model for verifying an operation of an LSI including two circuit blocks operable by a normally-on power supply and a circuit block. The simulation model is placed between the circuit blocks, and is operable by a power supply that is on/off-controlled in response to the state of an operation mode. Each circuit block includes a combination of basic logic cells, whose output signal is clearly defined by the combination of the input signals or an order of the input signals.

The circuit 10 includes first and second circuit blocks BLKA1 and BLKA2, each of which is operable by a first power supply VDA, and a third circuit block BLKB, which is placed between the first and second circuit blocks BLKA1 and BLKA2 and is operable by a second power supply VDB. The first power supply VDA continuously supplies voltage, and the on/off-condition of the second power supply VDB is controlled by a state of an operation mode. In the first, the second and the third circuit blocks BLKA1, BLKA2 and BLKB, all basic logic cells, which are circuit elements actually used for a real LSI, are replaced by verification logic cells which are used for a simulation only. The circuit 10 further includes first and second boundary cells BCA and BCB for verifying disconnection of the power supply. The first and second boundary cell BCA and BCB also are used only for the simulation. The first boundary cell BCA is a driver type cell, and the second boundary cell BCB is an AND type cell. These boundary cells BCA and BCB correspond to the pseudo-cells illustrated in FIG. 2.

There are two types of the verification logic cells; the first type includes a storage element and the second type does not include a storage element. For example, when the logic cell includes a storage element, such as a flip-flop circuit, then such a logic cell is replaced by the first type of the verification logic cell in the simulation mode, and when the logic cell does not include a storage element, then such a logic cell is replaced by the second type of the verification logic cell in the simulation mode. In the first type of the verification logic cell, a three-state buffer is added to the output of the storage element, and another three state buffer is added to each input. On the other hand, in the second type of the verification logic cell, a three-state buffer is added only to the output of the non-storage element, such as an AND gate.

As shown in FIG. 1, the third circuit block BLKB includes both types of the verification logic cells. Namely, the third circuit block BLKB includes a first verification logic cell 11, which has a storage element defined as the first type, and a second verification logic cell 12, which has a non-storage element defined as the second type. The first verification logic cell 11 includes a flip-flop circuit 11a and three three-state buffers 11b~11d. Second signals S2b and S2c are inputted to a data input terminal D and a clock terminal C of the flip-flop circuit 11a, through the three-state buffers 11b and 11c, respectively. An output terminal Q of the flip-flop circuit 11a is connected to the three-state buffer 11d, whose output terminal is connected to one of input terminals of a AND gate 12a of the second verification logic cell 12.

The second signal S2a is applied to another input terminal of the AND gate 12a, and a three-state buffer 12b is connected to the output terminal of the AND gate 12a. The three-state buffer 12b outputs a third signal S3a. A control terminal of each three-state buffer located in the first and second verification logic cells 11 and 12 is connected to the second power supply VDB that is also applied to the third circuit block BLKB.

The first boundary cell BCA manipulates a signal between the first circuit block BLKA1, which is operable by the first power supply VDA (normally-on power supply) and the third circuit block BLKB, which is operable by a second power supply VDB whose on/off condition is controlled in response to a state of an operation mode. The first boundary cell BCA includes a buffer 22 and a first judgment part 21, which decides in response to the condition of both of the first and the second power supply VDA and VDB whether or not the first signal Sla is transmitted to the buffer 22. A detail circuit configuration of the first judgment part 21 will be explained later. In response to the condition of both of the first and the second power supply VDA and VDB, the first judgment part 21 transmits the first signal Sla, which is supplied from the first circuit block BLKA1, outputs a signal having a predetermined logic value or makes its output terminal in high impedance state. As described above, the buffer 22 is connected to the output of the first judgment part 21, and outputs the second signal S2a to the third circuit block BLKB.

The second boundary cell BCB manipulates a signal between the third circuit block BLKA1 and the second circuit block BLKA2, which is operable by the first power supply VDA (normally-on power supply). The second boundary cell BCB includes an AND gate 23 and a second judgment part 24, which decides, in response to the condition of both of the first and the second power supply VDA and VDB, whether or not a signal from the second circuit block BLKA2 is transmitted to the AND gate 23. The second judgment part 24 consists of the same logical structure as the first judgment part 21. Thus, the detail circuit configuration of the first judgment part 21, which will be explained later, can also be applied to the second judgment part 24. In the second boundary cell BCB, the signal from the second circuit block BLKA2, which indicates the operation mode according to the power supply VDA, is inputted in the input of the second judgment part 24. The output of the second judgment part 24 is connected to one of two inputs of the AND gate 23. The AND gate 23 receives at another input the third signal S3a from the third circuit block BLKB, and outputs a fourth signal S4a to the second circuit block BLKA2.

Figure 3A:
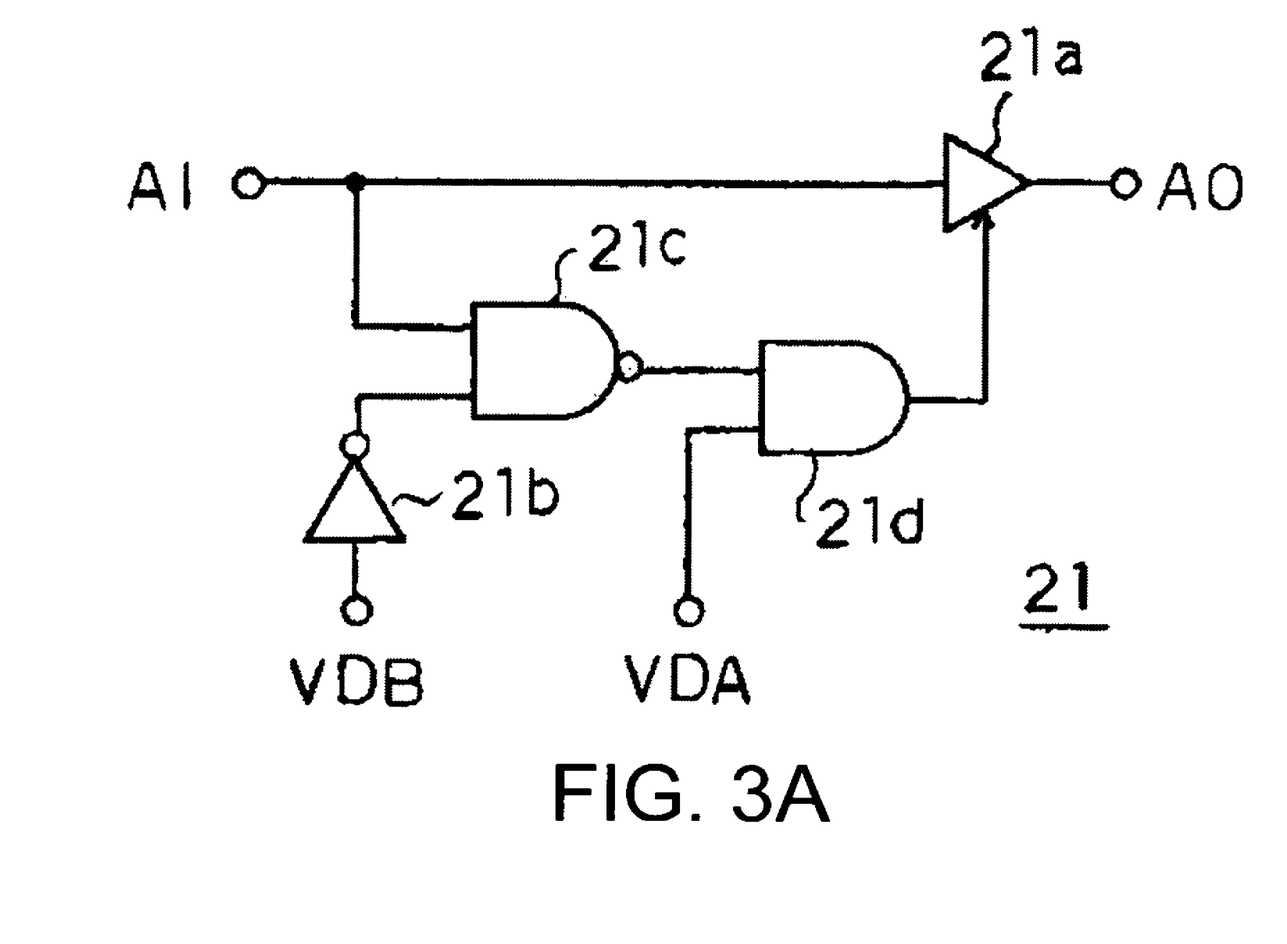
FIG. 3A is a circuit diagram of a judgment part in the circuit subjected to a simulation shown in FIG. 1.
Figure 3B:
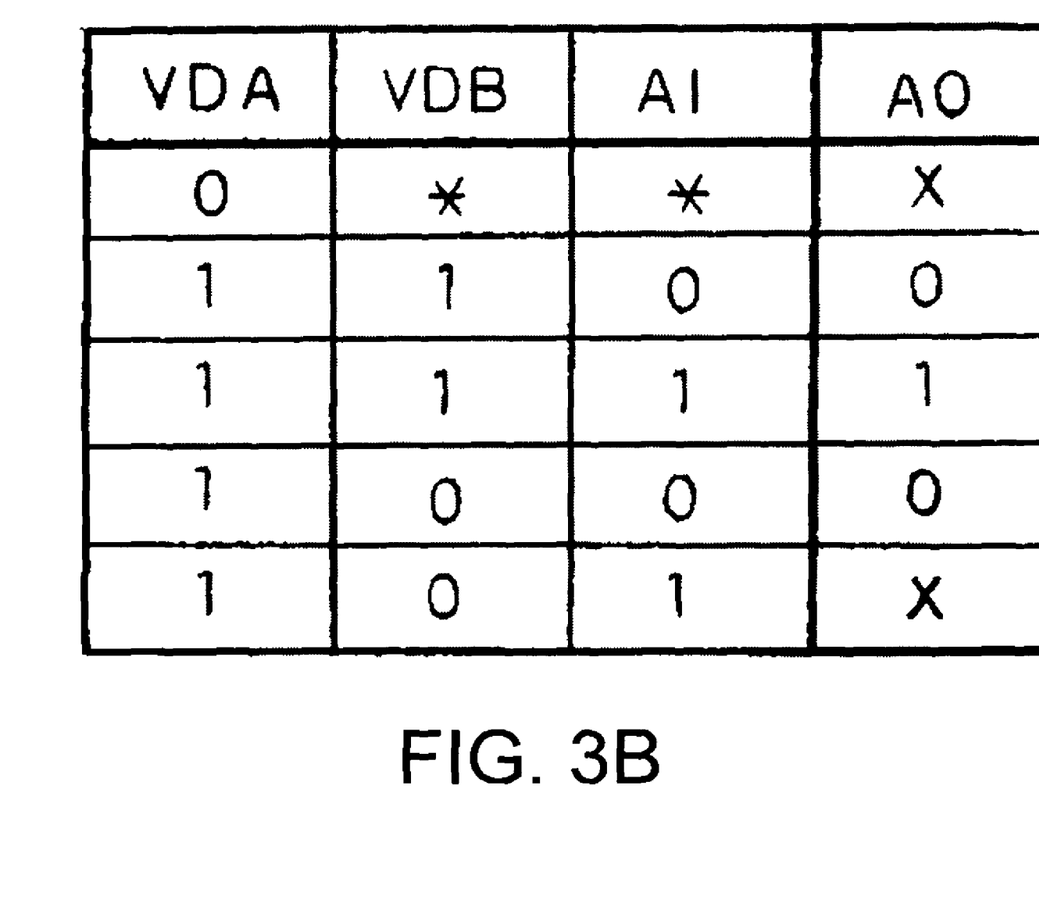
FIG. 3B is a truth table of the judgment part shown in FIG. 3A.

FIG. 3A is a circuit diagram of a first judgment part 21 in the circuit 10 subjected to simulation shown in FIG. 1 and FIG. 3B is a truth table of the first judgment part 21 shown in FIG. 3A. As described above, the second judgment part 24 consists of the same logical structure as the first judgment part 21, so that the following explanation of the first judgment part 24 can be applied to the second judgment part 24.

As shown in FIG. 3A, the first judgment part 21 includes a three-state buffer 21a, an inverter 21b, a NAND gate 21c and a AND gate 21d. The three-state buffer 21a receives an input signal AI and outputs an output signal AO. The inverter 21b inverts the logic level of the second power supply VDB. The NAND gate 21c receives the input signal AI and the output of the inverter 21b at its inputs. The AND gate 21d receives the output from the NAND gate 21c and the logic level of the first power supply VDA. The three-state buffer 21a is controlled by the output of the AND gate 21d.

According to the configuration of the first judgment part 21, as shown in the truth table of FIG. 3B, when the first power supply VDA is turned off, that is, the logic level of the first power supply VDA is "0", the logic level of the output signal AO is undetermined condition ("x") because the logic level "0" is always applied to the control terminal of the buffer 21a under this condition. As a result, the misconnection of the first power supply VDA can be found. When the second power supply VDB is turned on, that is, the logic level of the second power supply VDB is "1", the output signal AO having a same logic level of the input signal AI is outputted from the buffer 21a because the logic level "1" is always applied to the control terminal of the buffer 21a under this condition. When the second power supply VDB turns off and the logic level of the input signal AI is "0", the logic level of the output signal AO is "0". When the second power supply VDB turns off and the logic level of the input signal AI is "1" the output signal AO is undetermined condition ("x") so that it could be found that some of the logic circuits are misconnected.

Figure 4:
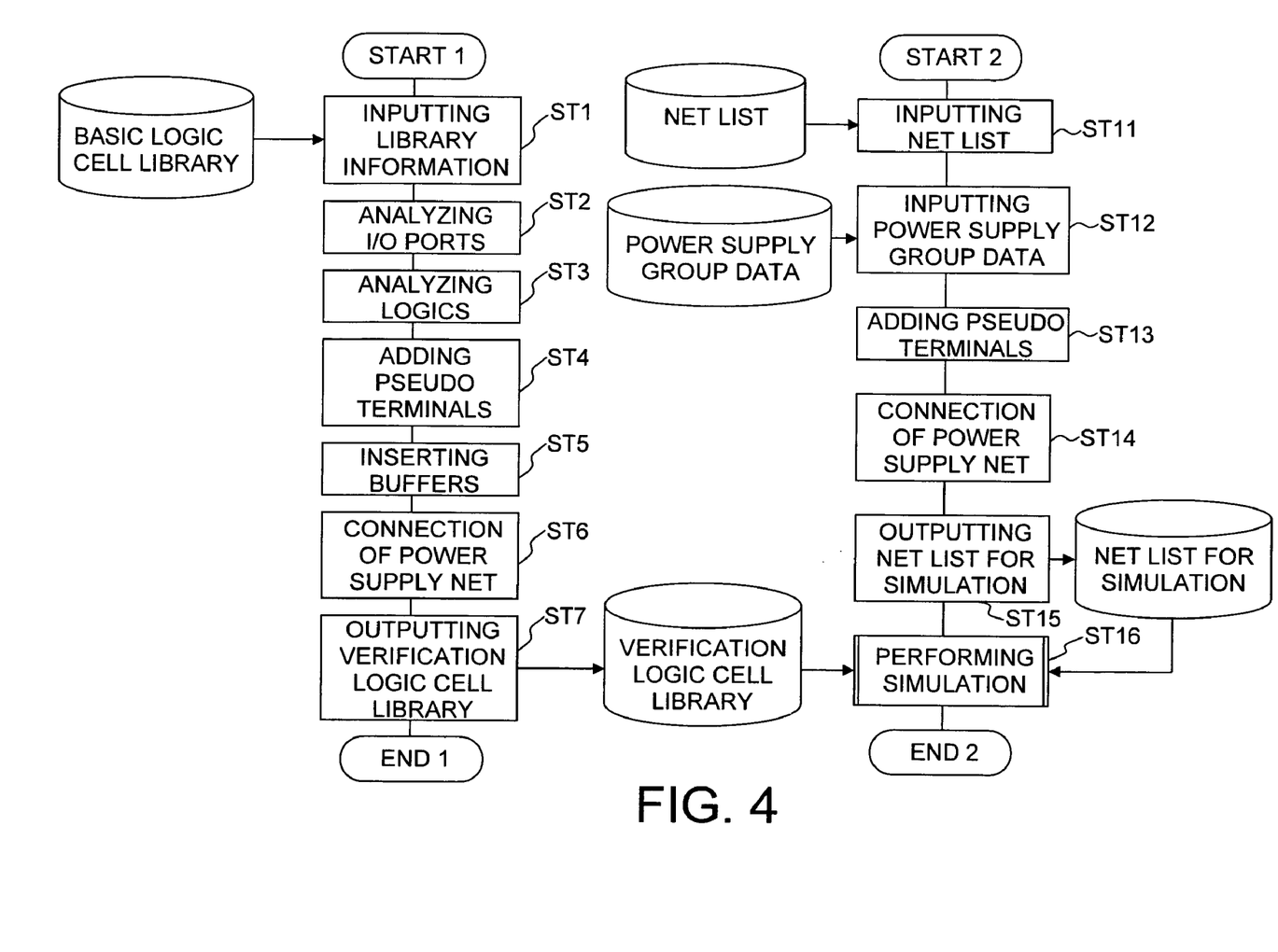
FIG. 4 is a flow chart of a simulation step using the circuit shown in FIG. 1.

FIG. 4 is a flow chart of a simulation step using the circuit shown in FIG. 1. In order to perform the logical simulation using the circuit 10, two processes are required; the first process is to create a common verification logic cell library, and the second process is to perform the simulation based on the individual LSI configuration.

The first process, which is to create a common verification logic cell library, is explained with reference to FIG. 4, specifically using step 1 through step 7.

In the first step ST1 (step 1), a basic logic cell library is installed. The basic logic cell library registers information as to kinds of basic logic cells, which are used for the general logical simulation. The basic logic cell is defined as a logic cell such as an AND gate, a NAND gate, an OR gate, a Flip-Flop circuit or a Shift register, which is used for designing an LSI, and each of these logic cells or its combination outputs a signal having the predetermined logic level in accordance with a combination of input signals and an order of the level change of each input signal.

In the second step ST2 (step 2), I/O port information for each basic logic cell installed is analyzed.

In the third step ST3 (step 3), logic level information of an output signal at the output of each basic logic cell is analyzed in accordance with a combination of the input signals and an order of the level change of each input signal, each of which has been analyzed in the step 2 and is applied to the input port.

In the fourth step ST4 (step 4), information regarding pseudo-terminals is added. The pseudo-terminals correspond to terminals 11e and 12c, each of which supplies the second power supply VDB to the first or second verification logic cell 11 or 12 illustrated in FIG. 1.

In the fifth step ST5 (step 5), three-state buffers are inserted to the basic logic cells. As described above, when a basic logic cell includes a storage element, three-state buffers are connected to each input of the basic logic cell, and one three-state buffer is connected to its output. When a basic logic cell does not include any storage elements, one three-state buffer is connected to its output. These three-state buffers correspond to the three-state buffers 11b~11d in the first verification logic cell 11 or the three-state buffer 12b in the second verification logic cell 12 illustrated in FIG. 1.

In the sixth step ST6 (step 6), a power supply network for each verification logic cell is connected. In other words, the control terminal of each three-state buffer 11b~11c is connected to the pseudo-terminal 11e and the control terminal of the three-state buffer 12b is connected to the pseudo-terminal 12c. By the connections, the verification logic cell is completed.

In the seventh step ST7 (step 7), the completed verification logic cell is registered into a verification logic cell library. In addition to the above-described steps for generating the verification logic cell from the basic logic cell, it is required to produce the first and second boundary cells BCA and BCB as illustrated in FIG. 1 and to register them to the verification logic cell library.

Next, the second process, which is for performing the simulation based on the individual LSI including basic logic cells, is explained. It is assumed that a net list in the gate-level, which is designed with basic logic cells, and power supply group data that indicates to which power supply lines each basic logic cell belongs, are completed by the completion of the logic design of the LSI.

In an eleventh step ST11 (step 11), the net list in the gate-level, which is designed with the basic logic cells, is installed.

In a twelfth step ST12 (step 12), the power supply group data that indicates to which power supply lines each basic logic cell belongs, is installed.

In a thirteenth step ST13 (step 13), pseudo power supply terminals for the verification logic cell are added, based on the power supply group data installed in step ST12. The pseudo power supply terminals correspond to terminals TA and TB, which supply the power supply voltages VDA and VDB to the first, second and third circuit blocks BLKA1, BLKA2 and BLKB, and the first and second boundary cells BCA and BCB illustrated in FIG. 1.

In a fourteenth step ST14 (step 14), the pseudo power supply terminals TA and TB are connected to the basic logic cells in each circuit block BLKA1, BLKA2 or BLKB and the first and second boundary cells BCA and BCB. Under these steps, the network list for the simulation, which establishes the relationship between one of the basic logic cells in each circuit blocks BLKA1, BLKA2 or BLKB and its corresponding power supply line, is completed.

In a fifteenth step ST15 (step 15), the net list for the simulation completed in step ST14 is outputted as a net list data.

In a sixteenth step ST16 (step 16), the simulation is performed by using the net list data outputted in step ST15 and the verification logic cell library registered in step ST7. The logic simulation for the circuit subjected to simulation, such as the circuit 10 illustrated in FIG. 1, is performed.

Under the logic simulation for the circuit 10 shown in FIG. 1, the third circuit block BLKS, which is operable with the second power supply BDB that is on/off-controlled in response to a state of the operation mode, is simulated as follows. Initially, when the logic level of the second power supply is set at "0", the outputs of the three-state buffers 11b and 11c, each of which is connected to one of the inputs of the flip-flop circuit 11a, is the undetermined condition ("x") in the first verification logic cell 11 because the logic level "0" is applied to the control terminal of each three-state buffer 11b and 11c. As a result, the logic signal under the undetermined condition is transferred to the flip flop circuit 11a. Thus, the internal condition of the flip-flop circuit 11a also becomes the undetermined condition ("x"). For this reason, the logic signal under the undetermined condition outputted from the flip-flop circuit 11a is transmitted to the next stage, which is the AND gate 12a, through the three-state buffer 11d.

Further, the second verification logic cell 12 transmits the third signal S3a having the undetermined condition to the next stage, which is the second boundary cell BCB, because the output of the three-state buffer 12b whose control terminal is connected to the second power supply BDB having the "0" level, is connected to the output of the third circuit block BLKB. Therefore, if the third circuit block BLKB outputs the signal S3a having the fixed condition under the state that the second power supply BDB having the "0" level is supplied, it can be expected that there are some logical mis-configurations of the basic logic circuits or some errors on the wiring of the power supplies.

On the other hand, the first boundary cell BCA manipulating a signal (such as first signal S1a) between the first circuit block BLKA1 and the third circuit block BLKB, confirms that the logic level of the first signal S1a is at "0" in order to avoid the occurrence of leakage current passing from the first circuit block BLKA1 to the third circuit block BLKB when the second power supply VDB for the third circuit block BLKB turns off.

Further, the second boundary cell BCB confirms that the logic level of the third signal S3a is at "0" in order to avoid the transmittance of the signal having the undetermined condition ("x") from the third circuit block BLKB to which the second power supply VDB having the "0" level is applied, to the second circuit block BLKA2 to which the first power supply VDA having the "1" level is applied. In the circuit 10 shown in FIG. 1, which is subjected to simulation, since one of the inputs of the second boundary cell BCB is connected to the output of the verification logic cell 12 of the third circuit block BLKB, the third signal S3a from the verification logic cell 12 is inputted to the AND gate 23 in the second boundary cell BCB. A signal having the logic level "1" from the second circuit block BLKA2 is applied to the other input of the second boundary cell BCB. The signal having the logic level "1" from the second circuit block BLKA2 is inputted to the second judgment part 24. Therefore, even if the second power supply VDB having the "0" level is applied, it is possible not to transmit the signal S4a having the undetermined condition to the second circuit block BLKA2.

Therefore, when the setting of the power supply group goes wrong in that some logic cells whose power supply is disconnected are used in the first or second circuit block BLKA1 or BLKA2 whose power supply is connected, the signal having the undetermined condition is transmitted on a certain logic circuit. As a result, an unexpected operation may be performed. Further, on the other hand, in the logic cell including a storage element, such as the verification logic cell 11, the logic level of the signal becomes an undetermined condition by disconnecting the power supply. As a result, logical defects at reconnecting the power supply can be detected.

According to the circuit 10 subjected to simulation of the preferred embodiment described above, it is possible to perform the accurate verification of the operation for an LSI having a plurality of circuit blocks at the time that the power supply is disconnected or reconnected while the conventional simulator can be used without any modification.

While the invention has been described with reference to illustrative embodiments, this description is not intended to be construed in a limiting sense. Thus, shapes, size and physical relationship of each component are roughly illustrated so the scope of the invention should not be construed to be limited to them. Further, to clarify the components of the invention, hatching is partially omitted in the cross-sectional views. Moreover, the numerical description in the embodiment described above is one of the preferred examples in the preferred embodiment so that the scope of the invention should not be construed to be limited to them.

For example,
(a) There are three circuit blocks disclosed in FIG. 1. However, numbers of circuit blocks is not limited to three (3);
(b) although the logic levels are used as "1" and "0", these logic levels can be replaced by a high level and a low level, respectively so that leakage current to a circuit block whose power supply is disconnected can be avoided;
(c) in the first or second judgment part 21 or 24, it is possible to delete the input of the first power supply VDA, on the basis that the first power supply VDA always turns on;
(d) even if a verification logic cell does not have a storage element, such as a verification logic cell 12, three-state buffers can be formed at the inputs of the logic cell therein.

Various other modifications of the illustrated embodiment will be apparent to those skilled in the art on reference to this description. Therefore, the appended claims are intended to cover any such modifications or embodiments as fall within the true scope of the invention.

What I claim is:

1. A method of verifying a logic circuit design for a semiconductor device having first, second and third circuit blocks, the first and the second circuit blocks continuously receiving power from a first power supply conductor, and the third circuit block being supplied with power from a second power supply conductor, the power supplied to the third circuit block from the second power supply conductor being turned on/off in response to operation modes of the semiconductor device, comprising:

a first process for retrieving a first boundary cell from a storage device and for placing the first boundary cell between the first and the third circuit blocks, the first boundary cell receiving a first signal and outputting a second signal having the same logic level as the first signal to the third circuit block when the power supplied by second power supply is turned on, or outputting the second signal having a low level to the third circuit block when the power supplied by the second power supply conductor is turned off;

a second process for retrieving a second boundary cell from the storage device and for placing the second boundary cell between the third and second blocks, the second boundary cell receiving a third signal and outputting a fourth signal to the second circuit block, the fourth signal having the same logic level as the third signal when the power supplied by the second power supply conductor is turned on and a fifth signal having a high level from the second circuit block is applied to the second boundary cell, the fourth signal having a low level when the power supplied by the second power supply conductor is turned off or the fifth signal that is applied to the second boundary cell from the second circuit block has a low level; and a third process for performing a logical simulation of the semiconductor device including the first and second boundary cells among the first through third circuit blocks, respectively, by the first and the second process.

2. A method of verifying a design of logic circuit of the semiconductor device as claimed in claim 1, wherein the first boundary cell in the first process includes,
(a) a first buffer having a control terminal, an input connected to the input of the first boundary cell and an output connected to the first boundary cell,
(b) a first inverter having an output and an input connected to the second power supply conductor,
(c) a first NAND gate having an output and two inputs, one of the inputs being connected to the input of the first boundary cell and the other input being connected to the output of the first inverter,
(d) a first AND gate having a output connected to the control terminal of the first buffer and two inputs, one of the inputs being connected to the output of the first NAND gate, and the other input being connected to the first power supply conductor, and
wherein the second boundary cell in the second process has two inputs and includes,
(e) a second AND gate having two third inputs, one of the inputs being connected to one of the inputs of the second boundary cell, and an output connected to the output of the second boundary cell,
(f) a second buffer having a control terminal, an input connected to another input of the second boundary cell and an output connected to another input of the second AND gate,
(g) a second inverter having an output and an input connected to the second power supply conductor,
(h) a second NAND gate having an output and two inputs, one of the inputs being connected to the input of the second boundary cell and another input being connected to the output of the second inverter,
(i) a third AND gate having a output connected to the control terminal of the second buffer and two inputs, one of the inputs being connected to the output of the second NAND gate, and another input being connected to the first power supply conductor.

3. A method of verifying a logic circuit design for a semiconductor device having a first circuit block, a second circuit block, and a third circuit block between the first and second circuit blocks, the first circuit block continuously receiving power from a first power supply conductor, and the third circuit block being supplied with power from a second power supply conductor, the power supplied to the third circuit block from the second power supply conductor turning on/off in response to operation modes of the semiconductor device, comprising:

a first process for replacing a first basic logic cell including a storage element, which is located in the third circuit block, with a first verification logic cell, which outputs a first signal as a logical result by its input signal incorporated only at a time that power is supplied from the second power supply conductor to the third circuit block;

a second process for replacing a second basic logic cell including no storage elements, which is located in the third circuit block, with a second verification logic cell, which outputs a second signal as a logical result only at a time that power is supplied from the second power supply conductor to the third circuit block;

a third process for retrieving a first boundary cell from a storage device and for placing a first boundary cell between the first and the third circuit blocks, the first boundary cell receiving a third signal and outputting a fourth signal having the same logic level as the third signal to the third circuit block when power supplied by the second power supply conductor is turned on or outputting the fourth signal having a low level to the third circuit block when power supplied by the second power supply conductor is turned off;

a fourth process for retrieving a second boundary cell from the storage device and for placing a second boundary cell between the third and the second blocks, the second boundary cell receiving a fifth signal and outputting a sixth signal, the sixth signal having the same logic level as the fifth signal when power supplied by the second power supply conductor is turned on and a seventh signal having a high level from the second circuit block is applied to the second boundary cell, the sixth signal having a low level when power supplied by the second power supply conductor is turned off or the seventh signal that is applied to the second boundary cell from the second circuit block has a low level;

a fifth process for performing a logical simulation of the semiconductor device including the first and second verification logic cells and the first and second boundary cells.

4. A method of verifying a design of logic circuit of the semiconductor device as claimed in claim 3, wherein the first verification logic cell in the first process includes,
(a) a first buffer, which is connected to the output of the first basic logic cell, and
(b) a second buffer, which is connected to the input of the first basic logic cell,
wherein the second verification logic cell in the second process includes
(c) a third buffer, which is connected to the output of the second basic logic cell,
wherein the first boundary cell in the first process includes
(d) a first buffer having a control terminal, an input connected to the input of the first boundary cell and an output connected to the first boundary cell,
(e) a first inverter having an output and an input connected to the second power supply conductor,
(f) a first NAND gate having an output and two inputs, one of the inputs being connected to the input of the first boundary cell and another of the inputs being connected to the output of the first inverter,
(g) a first AND gate having a output connected to the control terminal of the first buffer and two inputs, one of the inputs being connected to the output of the first NAND gate, and another of the inputs being connected to the first power supply conductor, and wherein the second boundary cell in the second process has two inputs and includes, (h) a second AND gate having two inputs, one of the inputs being connected to one of the inputs of the second boundary cell, and an output connected to the output of the second boundary cell, (i) a second buffer having a control terminal, an input connected to another input of the second boundary cell and an output connected to another input of the second AND gate, (j) a second inverter having an output and an input connected to the second power supply conductor, (k) a second NAND gate having an output and two inputs, one of the inputs being connected to the another of the inputs of the second boundary cell and another input being connected to the output of the second inverter, (l) a third AND gate having a output connected to the control terminal of the second buffer and two inputs, one of the inputs being connected to the output of the second NAND gate, and another of the inputs being connected to the first power supply conductor.

* * * * *